United States Patent
Deforge et al.

(10) Patent No.: US 12,188,976 B2
(45) Date of Patent: Jan. 7, 2025

(54) CAPTURE AND STORAGE FROM SIGNAL TAP POINTS IN A RADIO

(71) Applicant: Dell Products L.P., Round Rock, TX (US)

(72) Inventors: John Bradley Deforge, Chelsea (CA); Tommy Ivarsson, Ottawa (CA); Sewvanda Don, Ottawa (CA)

(73) Assignee: DELL PRODUCTS L.P., Round Rock, TX (US)

( * ) Notice: Subject to any disclaimer, the term of this patent is extended or adjusted under 35 U.S.C. 154(b) by 217 days.

(21) Appl. No.: 17/659,765

(22) Filed: Apr. 19, 2022

(65) Prior Publication Data

US 2023/0333156 A1 Oct. 19, 2023

(51) Int. Cl.
| | | |
|---|---|---|
| G01R 31/28 | (2006.01) | |
| G06F 17/14 | (2006.01) | |
| H04B 17/16 | (2015.01) | |
| H04B 17/19 | (2015.01) | |

(52) U.S. Cl.
CPC ......... *G01R 31/2822* (2013.01); *G06F 17/14* (2013.01); *H04B 17/16* (2015.01); *H04B 17/19* (2015.01)

(58) Field of Classification Search
CPC ...... G01R 31/2822; H04B 17/16; H04B 1/04; H04B 17/19; H04B 1/0475; H04B 7/2662; H04B 1/1027; H04B 17/221; H04B 17/14; H04B 17/0085; H04B 1/18; G06F 17/14
See application file for complete search history.

(56) References Cited

U.S. PATENT DOCUMENTS

| | | | | |
|---|---|---|---|---|
| 9,369,226 | B2 * | 6/2016 | Najatian | H04B 7/0671 |
| 2010/0246457 | A1 * | 9/2010 | Zhou | H04B 17/21 |
| | | | | 370/267 |
| 2012/0202442 | A1 * | 8/2012 | Li | H04W 56/001 |
| | | | | 455/115.2 |
| 2020/0162175 | A1 | 5/2020 | Kimmitt et al. | |
| 2022/0045713 | A1 | 2/2022 | Muhammad et al. | |

FOREIGN PATENT DOCUMENTS

EP 2530832 12/2012

OTHER PUBLICATIONS

International Search Report and Written Opinion for PCT Application No. PCT/US2022/053278 mailed Jun. 5, 2023, 18 pages.
Invitation to Pay Additional Fees for PCT Application No. PCT/US2022/053278 mailed Apr. 12, 2023, 12 pages.
Notification Concerning Transmittal of International Preliminary Report on Patentability for PCT Application No. PCT/US2022/053278 mailed Oct. 31, 2024, 11 pages.

* cited by examiner

*Primary Examiner* — Khanh C Tran
(74) *Attorney, Agent, or Firm* — Amin, Turocy & Watson, LLP

(57) ABSTRACT

A system can comprise a radio unit comprising a digital front end chain. The system can further comprise a tap point disposed within the digital front end chain, wherein the tap point is configured to time align a signal at the tap point with a system time of the radio unit. The system can further comprise a first hardware component that is configured to selectively read the signal at the tap point to produce a read signal. The system can further comprise a second hardware component that is configured to store the read signal.

20 Claims, 19 Drawing Sheets

900

FIRST HARDWARE COMPONENT THAT IS CONFIGURED TO SELECTIVELY READ A SIGNAL AT THE TAP POINT THAT IS DISPOSED WITHIN A DIGITAL FRONT END CHAIN OF A RADIO UNIT TO PRODUCE A READ SIGNAL 902

SECOND HARDWARE COMPONENT THAT IS CONFIGURED TO STORE THE READ SIGNAL 904

READING A FIRST SIGNAL FROM A FIRST TAP POINT THAT IS DISPOSED WITHIN A DIGITAL FRONT END CHAIN AND THAT CORRESPONDS TO A FIRST ANTENNA OF A RADIO UNIT 1104

READING A SECOND SIGNAL FROM A SECOND TAP POINT THAT IS DISPOSED WITHIN THE DIGITAL FRONT END CHAIN AND THAT CORRESPONDS TO A SECOND ANTENNA OF THE RADIO UNIT 1106

CAPTURE AND STORAGE FROM SIGNAL TAP POINTS IN A RADIO

BACKGROUND

A radio can comprise a receiver and a transmitter that are used to receive and transmit, respectively, data.

SUMMARY

The following presents a simplified summary of the disclosed subject matter in order to provide a basic understanding of some of the various embodiments. This summary is not an extensive overview of the various embodiments. It is intended neither to identify key or critical elements of the various embodiments nor to delineate the scope of the various embodiments. Its sole purpose is to present some concepts of the disclosure in a streamlined form as a prelude to the more detailed description that is presented later.

An example system can operate as follows. The system can comprise a radio unit comprising a digital front end chain. The system can further comprise a tap point disposed within the digital front end chain, wherein the tap point is configured to time align a signal at the tap point with a system time of the radio unit. The system can further comprise a first hardware component that is configured to selectively read the signal at the tap point to produce a read signal. The system can further comprise a second hardware component that is configured to store the read signal.

An example method can comprise identifying, by a system comprising a processor, a tap point disposed within a digital front end chain of a radio unit, wherein the tap point is configured to time align a signal at the tap point with a system time of the radio unit. The method can further comprise selectively reading, by the system, a signal from the tap point to produce a read signal. The method can further comprise storing, by the system, the read signal.

An example apparatus can comprise a first hardware component that is configured to selectively read a signal from a tap point that is disposed within a digital front end chain of a radio unit to produce a read signal, wherein the signal is time aligned at the tap point on a system time of the radio unit. The apparatus can further comprise a second hardware component that is configured to store the read signal.

BRIEF DESCRIPTION OF THE DRAWINGS

Numerous embodiments, objects, and advantages of the present embodiments will be apparent upon consideration of the following detailed description, taken in conjunction with the accompanying drawings, in which like reference characters refer to like parts throughout, and in which:

FIG. 9 illustrates another example system architecture that can facilitate capture and storage from signal tap points in a radio system, in accordance with an embodiment of this disclosure;

FIG. 11 illustrates another example process flow that can facilitate capture and storage from signal tap points in a radio system, in accordance with an embodiment of this disclosure;

DETAILED DESCRIPTION

Overview

Figure 1A:
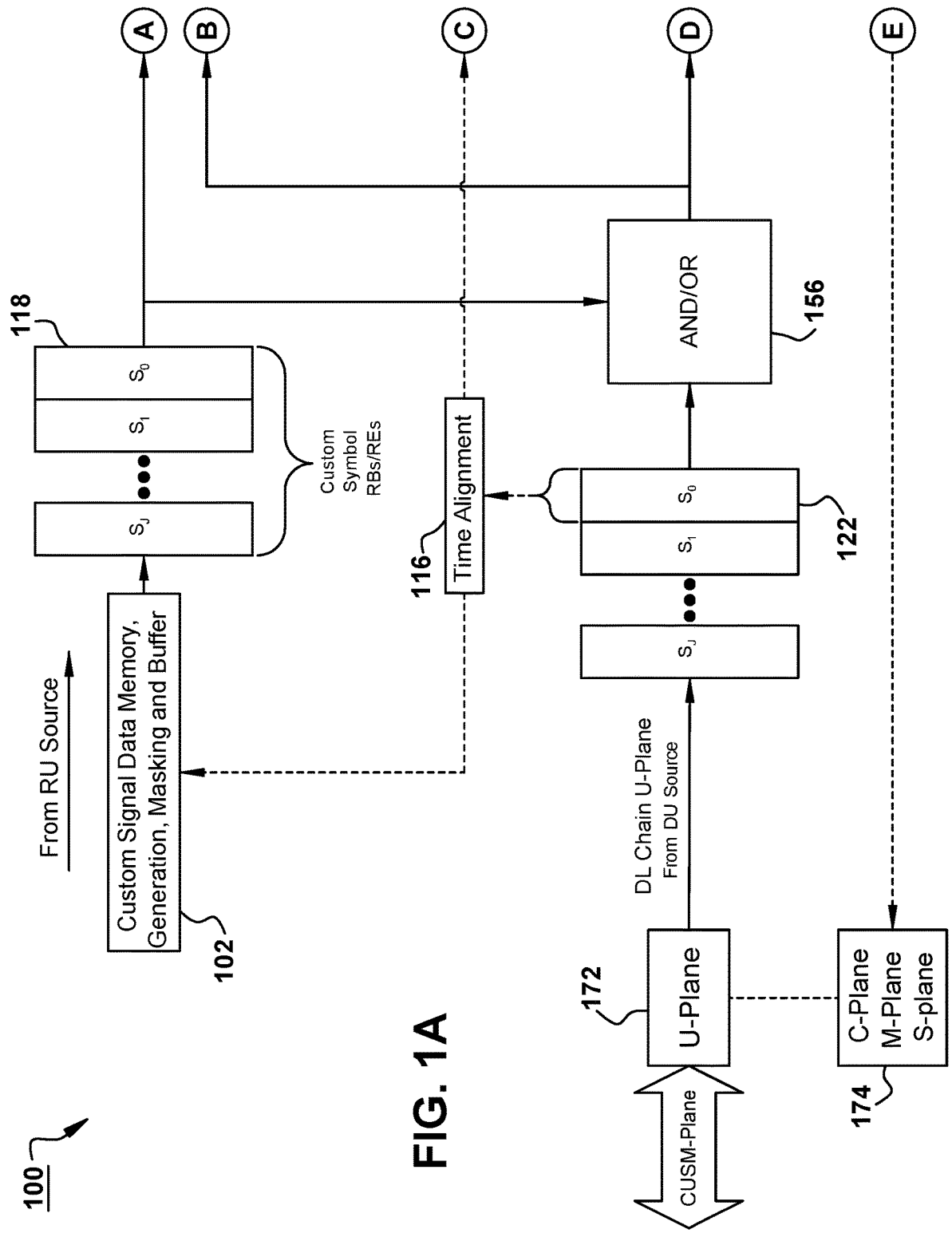
FIG. 1A, FIG. 1B, and FIG. 1C illustrate an example system architecture for capture and storage of a signal from tap points in a down link chain of a radio system, and that can facilitate capture and storage from signal tap points, in accordance with an embodiment of this disclosure.

In modern wireless communications deployments, aspects and impacts of radio development engineering and system design tradeoffs can have far-reaching implications into customer capital expenditures, operating expenditures and overall completeness of a vendor's radio offerings. These engineering and systems design tradeoffs can result in what can be generally characterized as overall radio size, weight, thermal dissipation, reliability, complexity, and cost.

An ability to capture and derive key performance data from a radio sub-systems can be tantamount to facilitating direct measurement and analysis of sub-system performance. Analogous to a signal analyzer or spectrum analyzer, an ability to read, record and recall data for further analysis can facilitate deeper understanding of metrics such as system performance and can be further used to determine improved performance aspects of system operation, long-term reliability, and customer satisfaction.

Signal data storage can be used for both near and long-term historical and statistical performance evaluation, such as a digital twin (where a computer program model of a hardware radio system is maintained), health assessments, early failure, no fault found (NFF) event capture, black box flight recorder, soft failure indicators, and/or aging assessments. Signal data storage can also facilitate autonomous operations of a radio network, such as by network efficiency management through artificial intelligence (AI)/machine learning (ML). In some examples, stored and streaming real-time data of a radio system can be used to train such an AI/ML component.

The present techniques can be implemented to use custom tap points designed into a digital front end path of a radio unit, and capture signal data. In some digital front ends, custom tap points are not a part of an operational signal path of a normal digital front end data path, and can be added according to the present techniques to support capture and storage from signal tap points in a radio.

In some examples, a signal can be captured from a tap point in a time domain, and transformed into a frequency domain. In some examples, the signal can be captured from the tap point in the time domain, and preserved in the time domain.

Data that is captured from a tap point in a digital front end can be stored and made available for further analysis.

In some examples, capture and storage of signals from tap points in a digital front end chain of a radio unit can be performed to capture a signal at certain digital front end blocks, such as a crest factor reduction output signal (CFR_OUT_Signal), a digital pre-distortion output signal (DPD_OUT_Signal), an error signal (Error_Signal), or a feedback receiver (FBRX_IN_Signal).

Signal data storage can be used for both near- and long-term historical and statistical performance evaluation. Examples of statistical performance evaluation can include a digital twin, a health assessment, early failure, no fault found (NFF) event capture, a black box flight recorder, soft failure indicators, and an aging assessment.

As described above, signal data storage can also facilitate autonomous operations of a radio network, such as by network efficiency management through artificial intelligence (AI)/machine learning (ML).

In some examples, signal capture can be performed in both a down link and an up link of a digital front end.

In some examples, with regard to capturing a signal at a tap point, a tap point can be considered to be a form of multiplexing, where a signal follows the normal path in a digital front end, and a copy of the signal splits off to another path, where it can be captured, stored, analyzed, and used to engage an actuator (that changes an operational parameter of the radio system).

In some examples, signal capture, storage, and analysis can be implemented in parts of a radio system other than a radio unit (which can generally convert signals sent to and from and an antenna to a digital signal that can be transmitted to a distributed unit), such as a distributed unit (which can be responsible for real time L1 and L2 scheduling functions), or a central unit (which can be responsible for non-real time, higher L2 and L3 scheduling functions).

In some examples, tap points can encompass analog aspects of a radio unit and routing for analysis.

Actuator blocks can be implemented in a radio system to derive and perform system performance modifications based on an analysis of captured signals.

In some examples, signals can be captured from multiple antenna branches of a radio system. In some examples, data can be captured from multiple different antenna branches simultaneously.

In some examples, frequency domain selectivity can be implemented with the present techniques. A specific area of a frequency domain can be zoomed to that is relevant to a regulatory specification. In some examples, time domain can be more generalized to root mean square (RMS) and peak power over specific periods of time. In some examples, a large portion of a digital front end can operate in a time domain.

In some examples, a signal can be captured from a transmission (Tx) signal path, a receiver (Rx) signal path, or a feedback receiver (FBRx) signal path.

For dimensioning, 1 inphase and quadrature (I+Q, or I/Q) value pair can be equivalent to 1 resource element (RE)/sub-carrier in a frequency domain. In some examples, dimensioning can comprise up to 4,096 REs of I+Q, 16 bit (signed) data pairs. Data can be triggered and time aligned with system timing on a symbol-by-symbol basis. In some examples, data can be time aligned with other relevant system time boundaries (such as via hardware-accelerated pre-conditioning of the signal).

Data can be captured in a variety of forms, and processed in a variety of ways. Data can be purely live-air traffic data (which can sometimes be referred to as mission mode data). Data can be from purely non-live-air traffic sources (where non-live-air traffic is sometimes referred to as non mission mode). Data can be a hybrid of live-air traffic and non-live-air traffic sources.

Captured data can be processed with or without cyclic prefix (CP) removal. Data can be captured and stored to memory over a single time boundary or multiple time boundaries.

Data analysis can be performed on current data, or contrasted with historical data that is stored in a database. Data can be stored in a raw data form, or an analyzed form. Data can be aligned on a symbol or other system time boundaries.

Data can be purely from sources internal to a radio unit's digital front end chain, or a combination of a digital front end chain and an analog chain.

Signal data storage can be used for both near- and long-term historical statistical performance evaluation. Similar to as described above, this performance evaluation can comprise a digital twin, health assessments, early failure, NFF event capture, black box flight recorder, soft failure indicators, and/or aging assessments. Signal data storage can also facilitate autonomous operations of a radio network, such as by network efficiency management through AI/ML.

In examples according to the present techniques, a flow of reading signal data can be started and stopped at key radio time elements (which can sometimes be referred to as "gating"). This selective filtering can be performed based on time (that is, a signal can be read for a certain time period), or frequency (that is, certain frequencies of the signal can be read). This can be viewed in contrast to prior approaches that can involve a broad capture of data on a non-dynamic time frame.

Starting and stopping a flow of data that is read, as well as selecting frequency data can comprise preselecting data so that it can be efficiently analyzed.

Data at a tap point that can be read can be synchronized, or time aligned, with a system timing function of a radio unit.

In some examples, a tap point is disposed in a time domain portion of a radio system. In such examples, a fast Fourier transform can be performed on read data to convert it from a time domain to a frequency domain.

A tap point according to these present techniques can be time aligned relative to the radio system, and provide an ability to extract data in a time domain or a frequency domain. In some examples, hardware acceleration can perform initial processing of data captured at a tap point through time grating, frequency selection, peak and root mean square (RMS) power detection, statistical accumulation, etc. After initial processing, the data can be stored, and the stored data can be made available for analysis.

In some examples, the analysis can include real time training and analysis (such as through ML/AI techniques), and longer-term analysis (such as a centralized database modeling a digital twin of the radio system, or performing predictive modeling).

This analysis can be used, for example, to adjust operational parameters of the radio system to increase the radio system's performance.

Radio timing elements that can be utilized in implementing the present techniques can include time-division duplexing (TDD) timing, transmitter (Tx) blanking, power amplifier (PA) ON/OFF, gate start/stop/pause timing offset, symbol/slot/frame boundaries, glitch triggering, time boundary transitions triggering, accumulated/processed data event triggering, fault event triggering, pipeline delay, etc.

Example Architectures

Figure 1B:
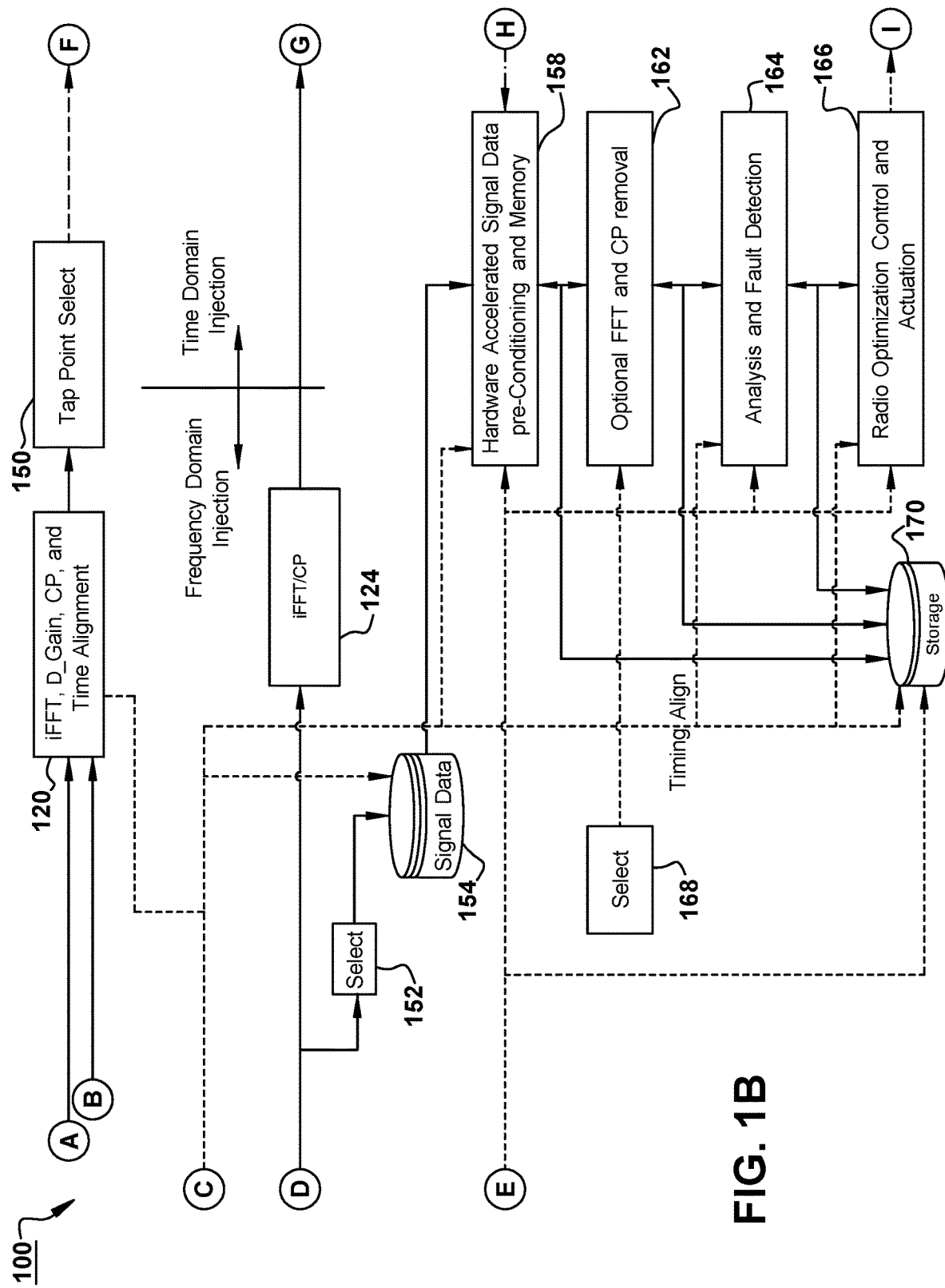
Figure 1C:
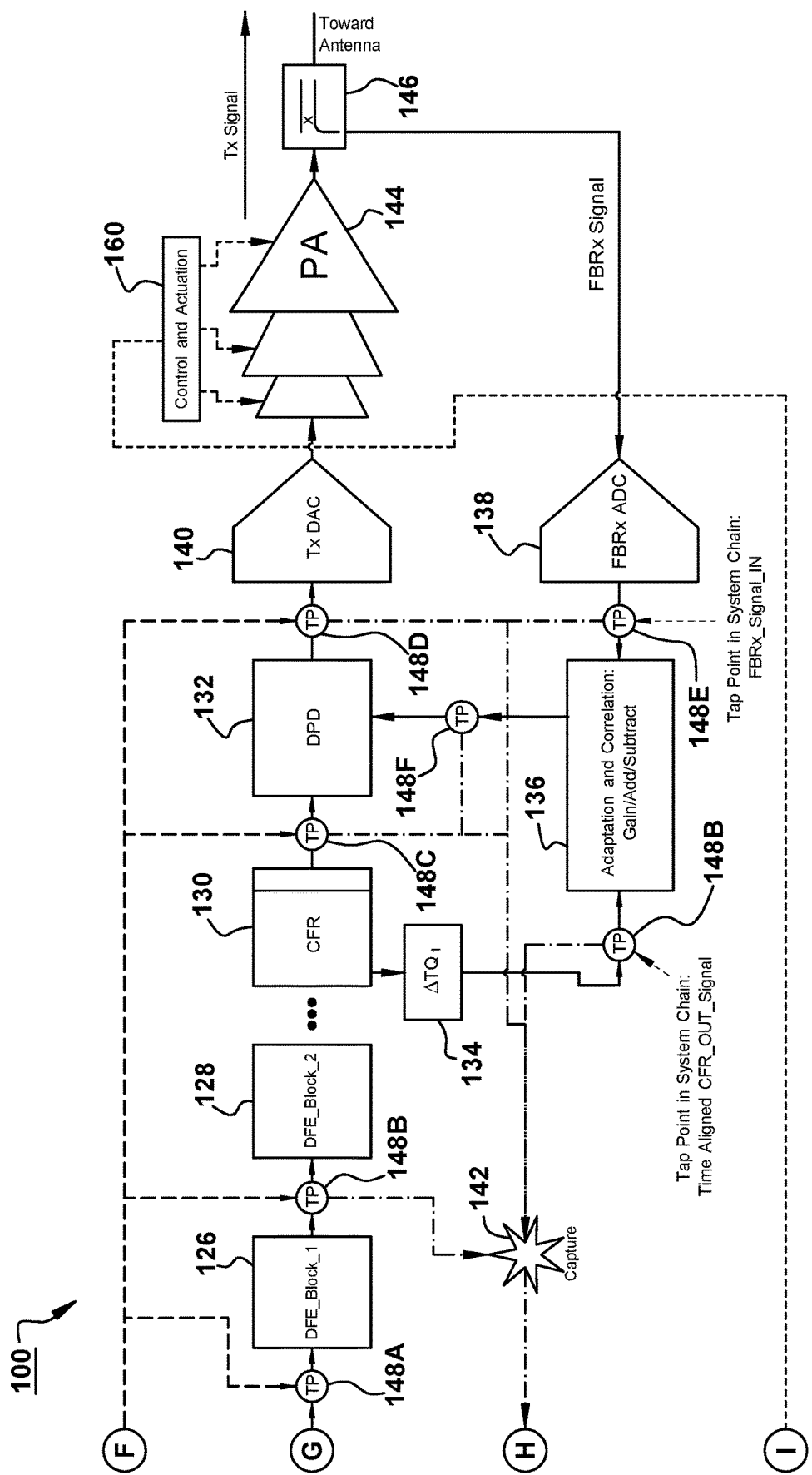

FIG. 1A, FIG. 1B, and FIG. 1C illustrate an example system architecture 100 for capture and storage of a signal from tap points in a down link chain of a radio system, and that can facilitate capture and storage from signal tap points, in accordance with an embodiment of this disclosure;

System architecture 100 can function as a down link signal path of a radio. As depicted, system architecture 100 comprises custom signal data memory, generation, masking, and buffer 102 (which can comprise a combination of some or all of a look up table, a pseudo-random look up table generator, a generator, a memory, an OR gate to combine data sources, masking, and a buffer), time alignment 116, custom symbol resource blocks/resource elements (RBs/REs) 118, inverse Fast Fourier Transform (iFFT) 120 (which can also perform A gain, time alignment, and optional cyclic prefix (CP) insertion), RB/RE 122, iFFT/CP 124, digital front end (DFE) block 1 126, DFE block 2 128, crest factor reduction (CFR) 130, digital pre-distortion (DPD) 132, delta-time-phase (ΔTΘ) 134, adaptation and correlation 136, feedback receiver analog-to-digital converter (FBRx ADC) 138, transmitter digital to-analog converter (Tx ADC) 140, capture 142, power amplifier 144, signal coupler 146, tap point 148A, tap point 148B, tap point 148C, tap point 148D, tap point 148E, tap point 148F (which can be accessed to capture a FBRx_Signal_IN), tap point 148G (which can be accessed to capture a CFR_OUT_Signal), tap point select 150, select 152, signal data 154, AND/OR 156, hardware accelerated signal data pre-conditioning and memory 158, optional FFT and CP removal 162, analysis and fault detection 164, radio optimization control and actuation 166, select 168, storage 170, U-plane 172, and C-plane, M-plane, and S-plane 174.

In different examples, different blocks of system architecture 100 can be implemented and/or used. For example, optional FFT and CP removal 162 can be selectively implemented and/or used to provide a time domain full signal (no FFT, and no CP removal); to provide time domain data only (no FFT, with CP removal); to provide frequency domain of a whole signal (with FFT, no CP removal); and/or frequency domain data only (with FFT, with CP removal).

In system architecture 100, each tap point (e.g., tap point 148A) can serve as a multiplexer where one copy of the signal is sent through the signal chain as it would be if there were no tap point, and another copy of the signal is sent to be selectively captured. Time alignment 116 can align a signal at each tap point with a system time of the down link chain.

A copy of a signal that is split at a tap point can be sent to capture 142, where the signal can be captured. As depicted, each tap point is in the time domain of the down link chain, and there can be examples where a tap point is positioned in a frequency domain portion of the down link chain.

Once captured, the captured signal can proceed through hardware accelerated signal data pre-conditioning and memory 158. Hardware accelerated signal data pre-conditioning and memory 158 can perform operations such as optional FFT and optional CP removal, analysis, and storage. A result of this analysis can be used to cause actuators to change operational parameters of the radio system.

Figure 2A:
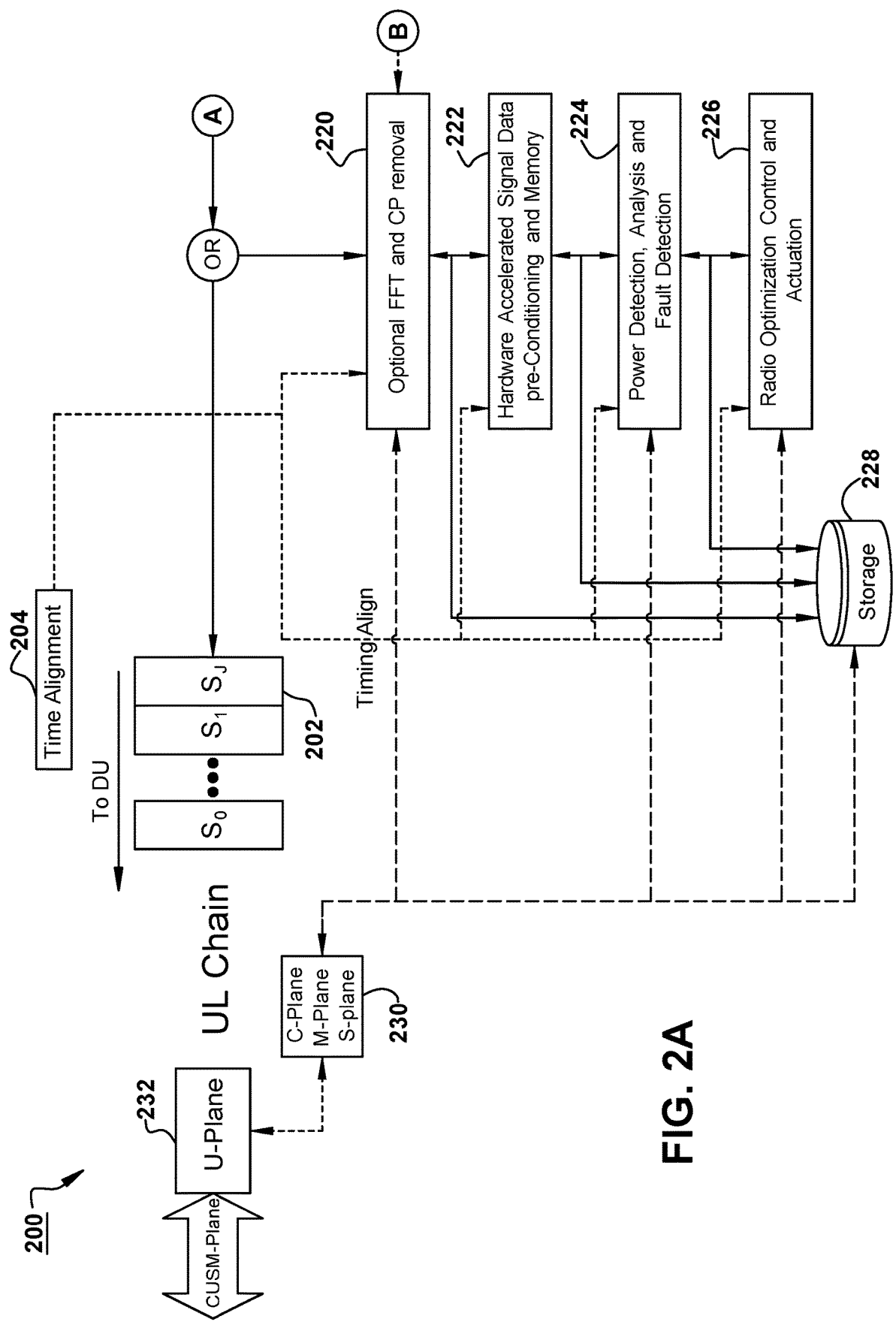
FIG. 2A and FIG. 2B illustrate an example system architecture for capture and storage of a signal from tap points in an up link chain of a radio system, and that can facilitate capture and storage from signal tap points, in accordance with an embodiment of this disclosure.
Figure 2B:
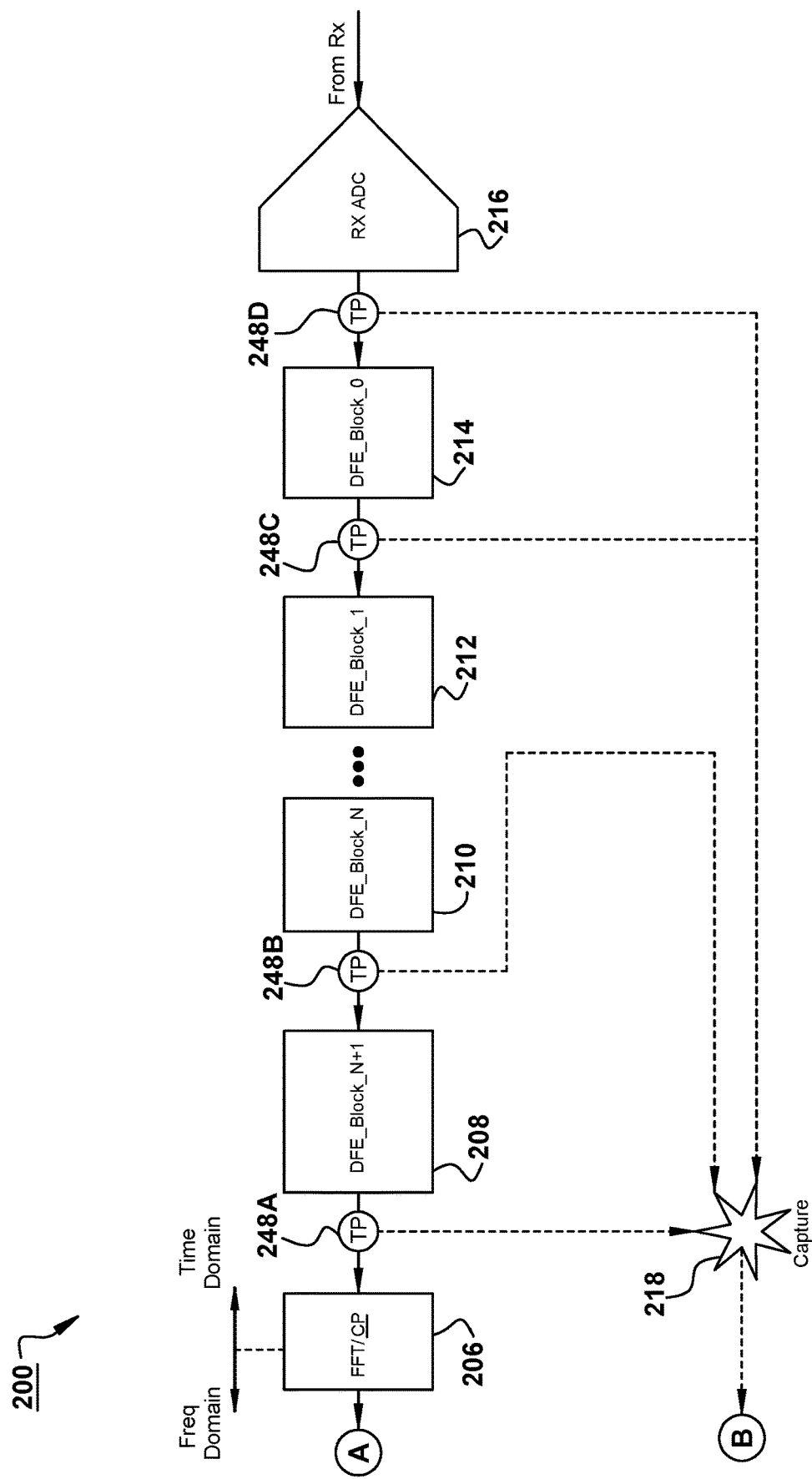

FIG. 2A and FIG. 2B illustrate an example system architecture 200 for capture and storage of a signal from tap points in an up link chain of a radio system, and that can facilitate capture and storage from signal tap points, in accordance with an embodiment of this disclosure. In some examples, system architecture 200 can be implemented in conjunction with system architecture 100 of FIGS. 1A, 1B, and 1C, where system architecture 200 implements an up link chain of a radio system, and system architecture 100 implements a corresponding down link chain.

As depicted, system architecture 200 comprises custom symbol RBs/REs 202; time alignment 204; FFT/CP 206; DFE block N+1 208; DFE block N 210; DFE block 1 212; DFE block 0 214; Rx ADC 216; capture 218; optional FFT and CP removal 220; hardware accelerated signal data pre-conditioning and memory 222; power detection, analysis, and fault detection 224; radio optimization control and actuation 226; storage 228; C-plane, M-plane, S-plane 232; U-plane 234; tap point 248A (which can be similar to an instance of tap point 148A); tap point 248B (which can be similar to an instance of tap point 148A); tap point 248C (which can be similar to an instance of tap point 148A); and tap point 248D (which can be similar to an instance of tap point 148A).

In system architecture 200, each tap point (e.g., tap point 248A) can serve as a multiplexer where one copy of the signal is sent through the signal chain as it would be if there were no tap point, and another copy of the signal is sent to be selectively captured. Time alignment 204 can align a signal at each tap point with a system time of the down link chain.

A copy of a signal that is split at a tap point can be captured. Some tap points can be positioned in the time domain of the up link chain (e.g., tap point 248A, tap point 248B, tap point 248C, and tap point 248D). In some examples, some tap points can be positioned in a frequency domain portion of the down link chain.

Once captured, the captured signal can be processed with hardware accelerated signal data pre-conditioning and memory (which can include operations such as optional FFT and optional CP removal, analysis, and storage. A result of this analysis can be used to cause actuators to change operational parameters of the radio system.

Figure 3A:
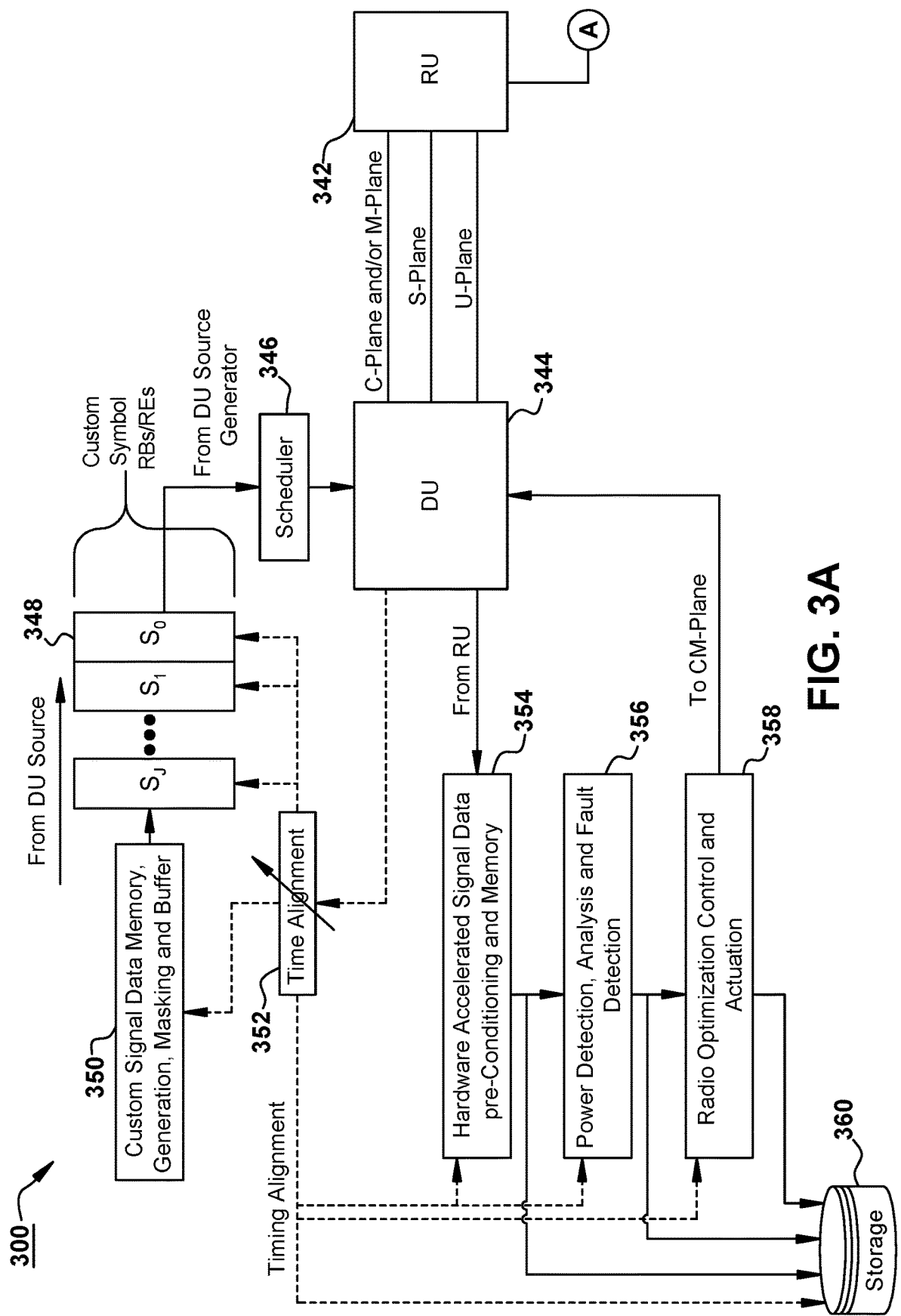
FIG. 3A and FIG. 3B illustrate an example system architecture for a radio unit, and that can facilitate capture and storage from signal tap points, in accordance with an embodiment of this disclosure.
Figure 3B:
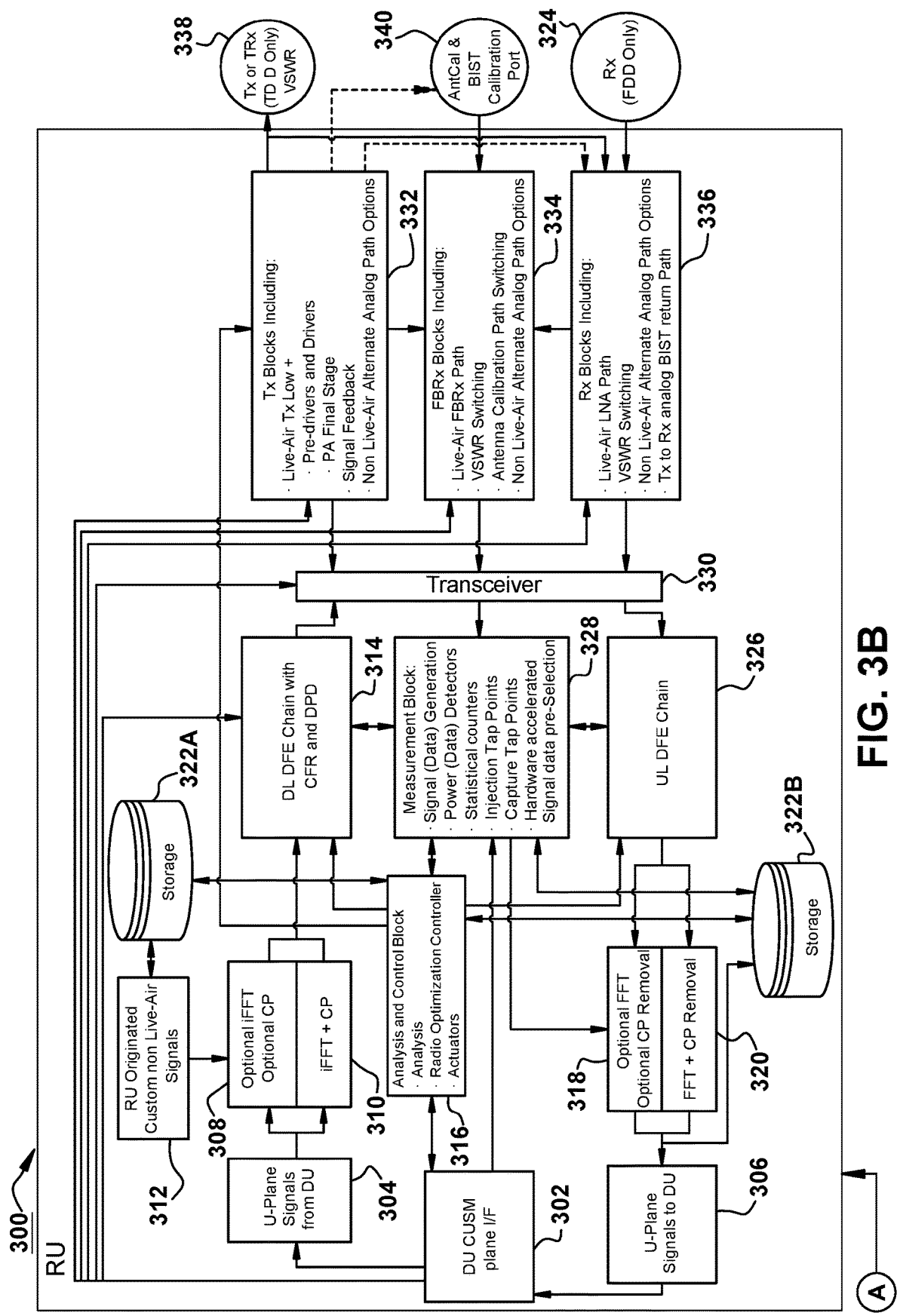
Figure 4A:
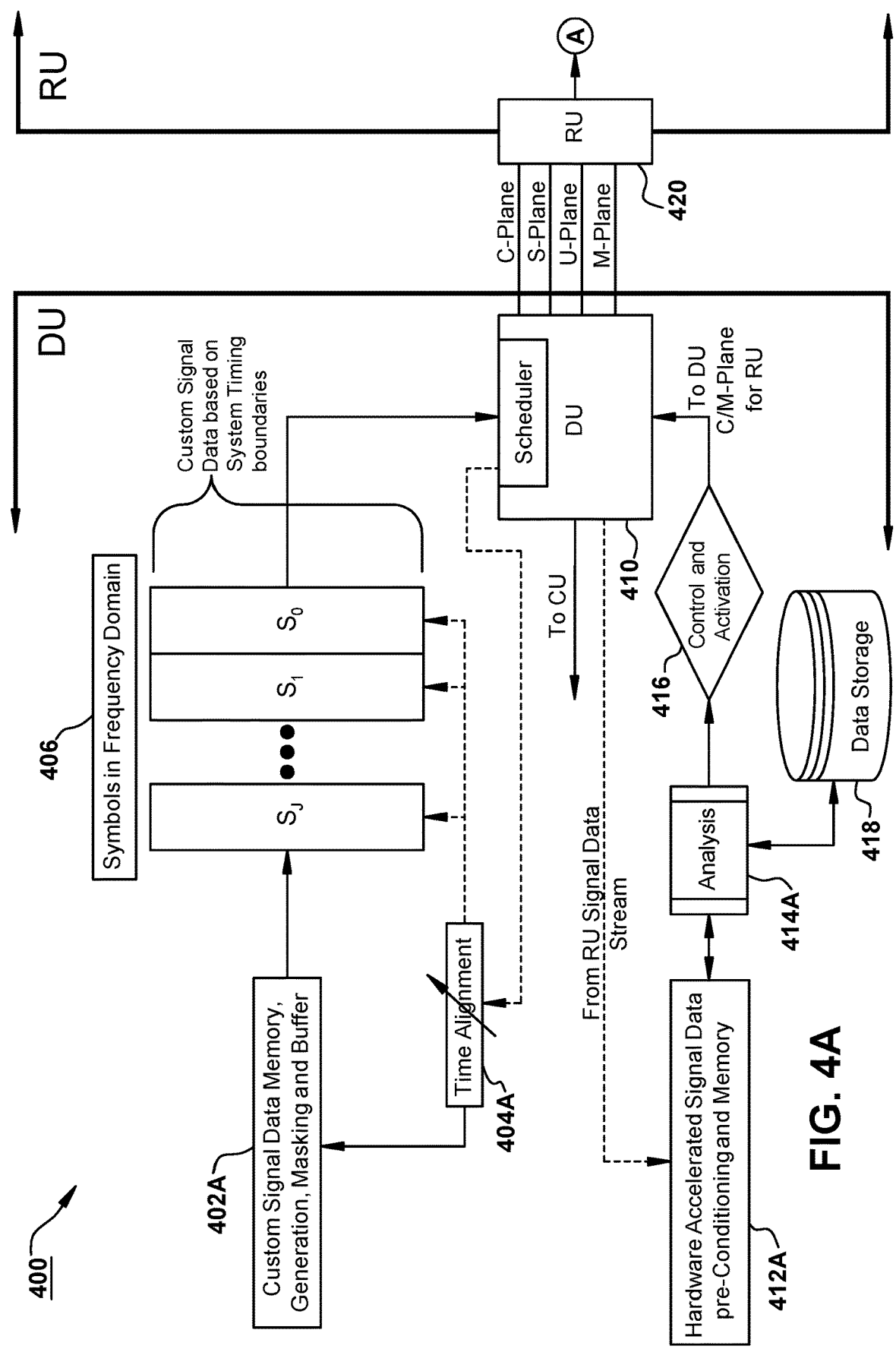
FIG. 4A, FIG. 4B, FIG. 4C, and FIG. 4D illustrate an example system architecture for a radio system, and that can facilitate capture and storage from signal tap points, in accordance with an embodiment of this disclosure.
Figure 4B:
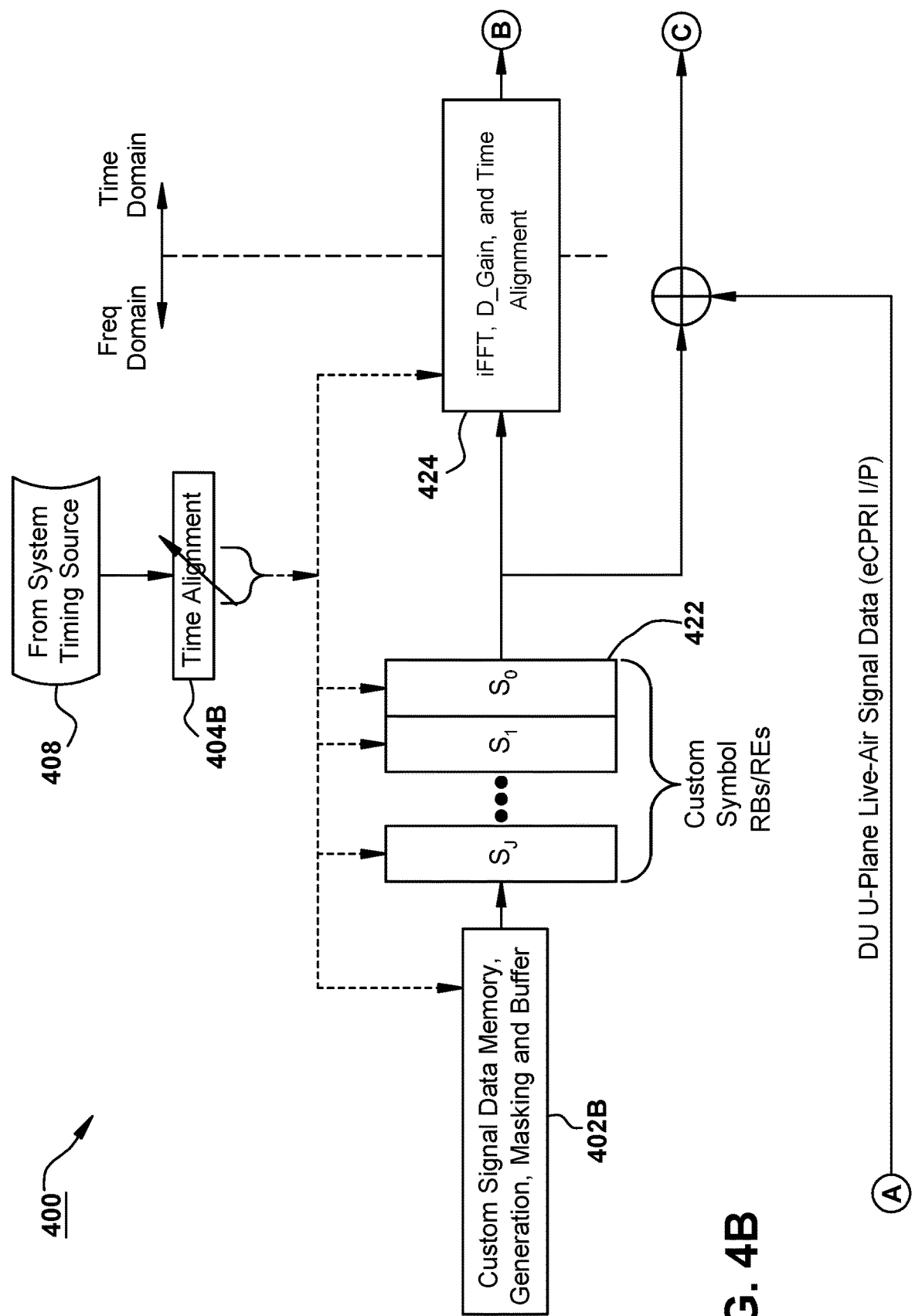
Figure 4C:
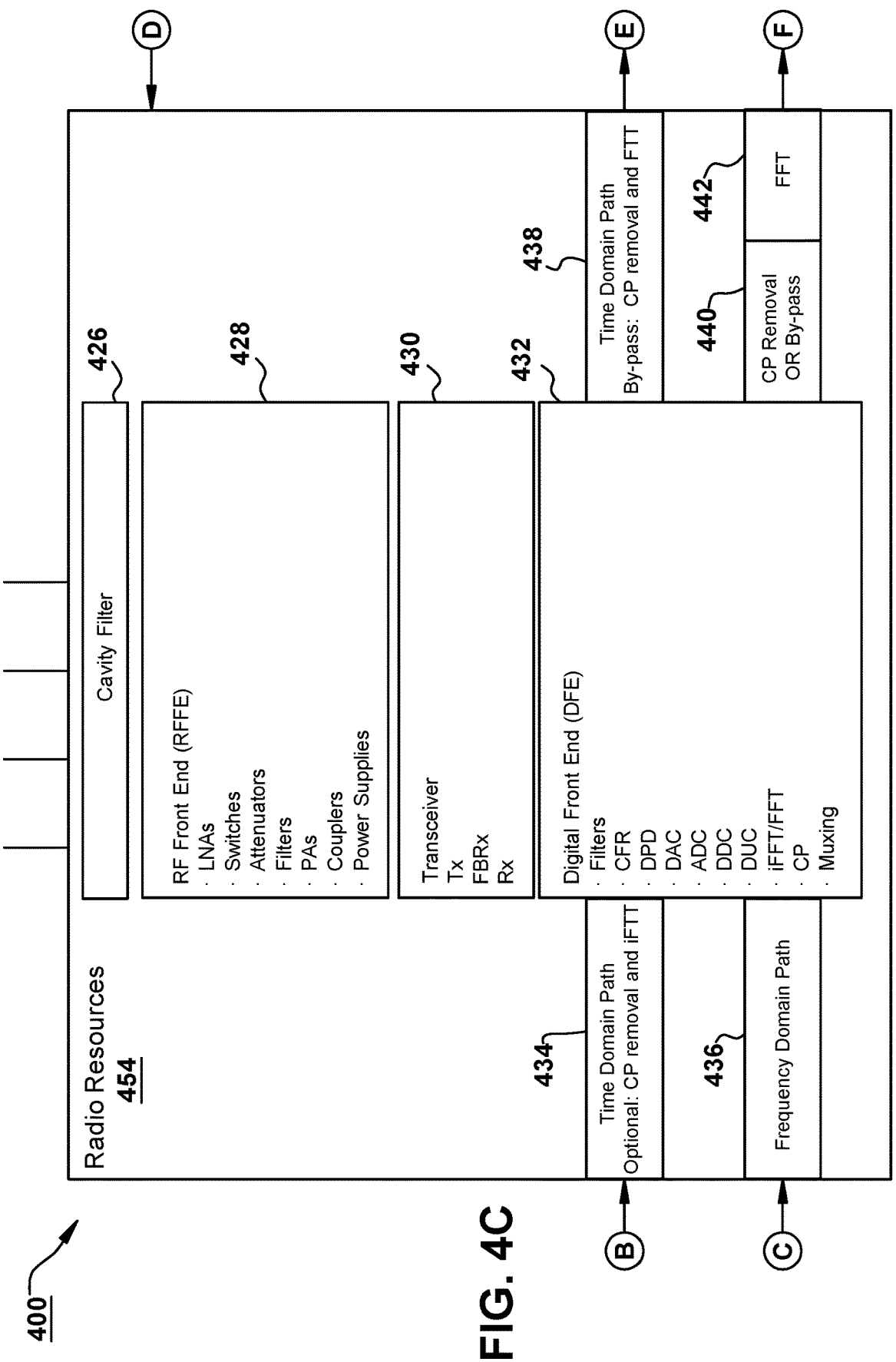
Figure 4D:
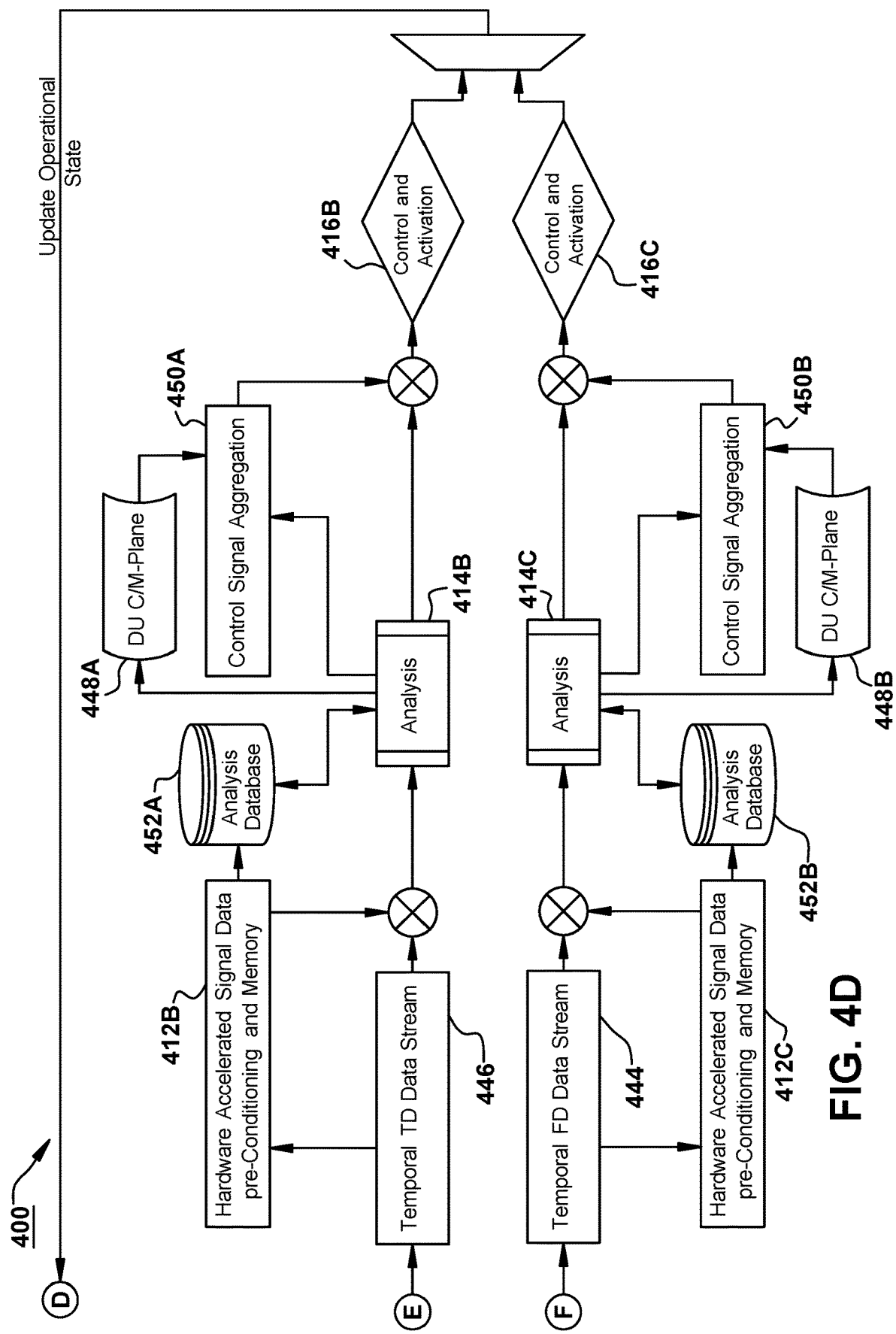

FIG. 3A and FIG. 3B illustrate an example system architecture 300 for a radio unit, and that can facilitate capture and storage from signal tap points in a radio system, in accordance with an embodiment of this disclosure. In some examples, system architecture 300 can comprise a radio unit that comprises part(s) of system architecture 100 of FIGS. 1A, 1B, and 1C as a down link chain, and part(s) of system architecture 200 as an up link chain.

As depicted, system architecture 300 comprises distributed unit (DU) control user synchronization management (CUSM) plane interface (I/F) 302, live-air traffic signals from DU 304, live-air traffic signals to DU 306, optional iFFT and CP 308, iFFT and CP 310, radio unit (RU) originated custom non-live-air traffic signals 312, DL DFE chain 314, radio optimization controller 316, optional FFT and optional CP removal 318, FFT and CP removal 320, waveform/RB/RE signal data storage 322A and waveform/RB/RE signal data storage 322B, Rx port 324, UL DFE chain 326, measurement block 328, transceiver 330, transmission (Tx) blocks 332, feedback receiver (FBRx) blocks 334, receiver (Rx) blocks 336, Tx or transceiver (TRx) port 338, and antenna calibration (AntCal) and built-in self-test (BIST) calibration port 340.

Down link (DL) DFE chain 314 can include CFR and DPD. Measurement block 328 can comprise signal (data) generation, power (data) detectors, statistical counters, injection tap points, capture tap points, and/or hardware accelerated signal data pre-selection.

Tx blocks 332 can include Tx low, pre-drivers and drivers, power amplifier (PA) final stage, signal feedback, and non-live-air traffic alternate analog path options. FBRx blocks 334 can include a live-air traffic FBRx path, voltage standing wave ratio (VSWR) mode switching, and non-live-air traffic alternate analog path options. Rx blocks 336 can include a live-air traffic low noise amplifier (LNA) path, VSWR switching, and non-live-air traffic analog path options. Rx port 324 can include a separate port for the case of frequency-division duplexing (FDD) radio architectures.

These above components of system architecture 300 can be part of radio unit (RU) 342. System architecture 300 also comprises distributed unit (DU) 344, scheduler 346, custom symbol resource blocks/resource elements (RBs/REs) 348, custom signal data memory, generation, masking, and buffer 350, time alignment 352, hardware accelerated signal data pre-conditioning and memory 354, analysis and fault detection 356, radio optimization control and actuation 358, and storage 360.

In system architecture 300, signals can be captured and stored at measurement block 328.

FIG. 4A, FIG. 4B, FIG. 4C, and FIG. 4D illustrate an example system architecture 400 for a radio system, and that can facilitate capture and storage from signal tap points in a radio system, in accordance with an embodiment of this disclosure. In some examples, system architecture can comprise a radio system that can comprise part(s) of system architecture 100 of FIGS. 1A, 1B, and 1C, system architecture 200, and/or system architecture 300.

As depicted, system architecture 400 comprises custom signal data memory, generation, masking, and buffer 402A and custom signal data memory, generation, masking, and buffer 402B; time alignment 404A and time alignment 404B; custom symbol RBs/REs 406; from timing system source 408; distributed unit 410; hardware accelerated signal data, pre-conditioning and memory 412A, hardware accelerated signal data, pre-conditioning and memory 412B, and hardware accelerated signal data, pre-conditioning and memory 412C; analysis 414A, analysis 414B, and analysis 414C; control and activation 416A, control and activation 416B, and control and activation 416C; data storage 418; RU 420; custom symbol RBs/REs 422; inverse Fast Fourier Transform (iFFT) 424 (which can also perform A gain, cyclic prefix insertion, and time alignment); cavity filter 426; radiofrequency (RF) front end (RFFE) 428 (which can include low noise amplifiers (LNAs), switches, attenuators, filters, PAs, couplers, and power supplies); transceiver 430 (which can include Tx, FBRx, and Rx); digital front end 432 (which can include filters, CFR, DPD, a digital to analog converter (DACs), an analog to digital converter (ADC), a digital down converters (DDC), a digital up converter (DUC), and iFFT/FFT, CP, and multiplexing); time domain path 434 (which can bypass CP injection and iFFT); frequency domain path 436; time domain path 438 (which can bypass CP removal and FFT); CP removal or bypass 440; FFT 442; temporal frequency domain (FD) data stream 444; temporal time domain (TD) data stream 446; DU C/M-plane 448A and DU C/M-plane 448B; control system aggregation 450A and control system aggregation 450B; analysis database 452A and analysis database 452B; and radio resources 454.

Hardware accelerated signal data, pre-conditioning and memory 412A, and hardware accelerated signal data, pre-conditioning and memory 412C can perform frequency domain signal data detection. They can perform a binning operation, which can be akin to a functionality performed by a spectrum analyzer digitizer.

Hardware accelerated signal data, pre-conditioning and memory 412B can perform time domain signal data detection. It can perform binning and storage operations, which can be akin to an oscilloscope digitizer.

Custom signal data memory, generation, masking, and buffer 402A and custom signal data memory, generation, masking, and buffer 402B can perform signal generation at a distributed unit or a radio unit, respectively. They can perform local synchronized custom and live-air data stimulus with known characteristics. In some examples, they can operate in a frequency domain.

Analysis 414A, analysis 414B, and analysis 414C can perform signal capture data analysis. In some examples, they can implement artificial intelligence/machine learning (AI/ML) with training (such as live and stored real-time data, and statistical data). They can provide an output of a response to actuators to change operational parameters of a radio system.

Control and activation 416A, control and activation 416B, and control and activation 416C can take inputs that augment information available to an AI/ML component and output an affect to actuators of the radio system to change operational parameters.

In some examples, respective outputs of control and activation 416B and control and activation 416C can be aggregated to affect change on a radio and radio performance.

Figure 5:
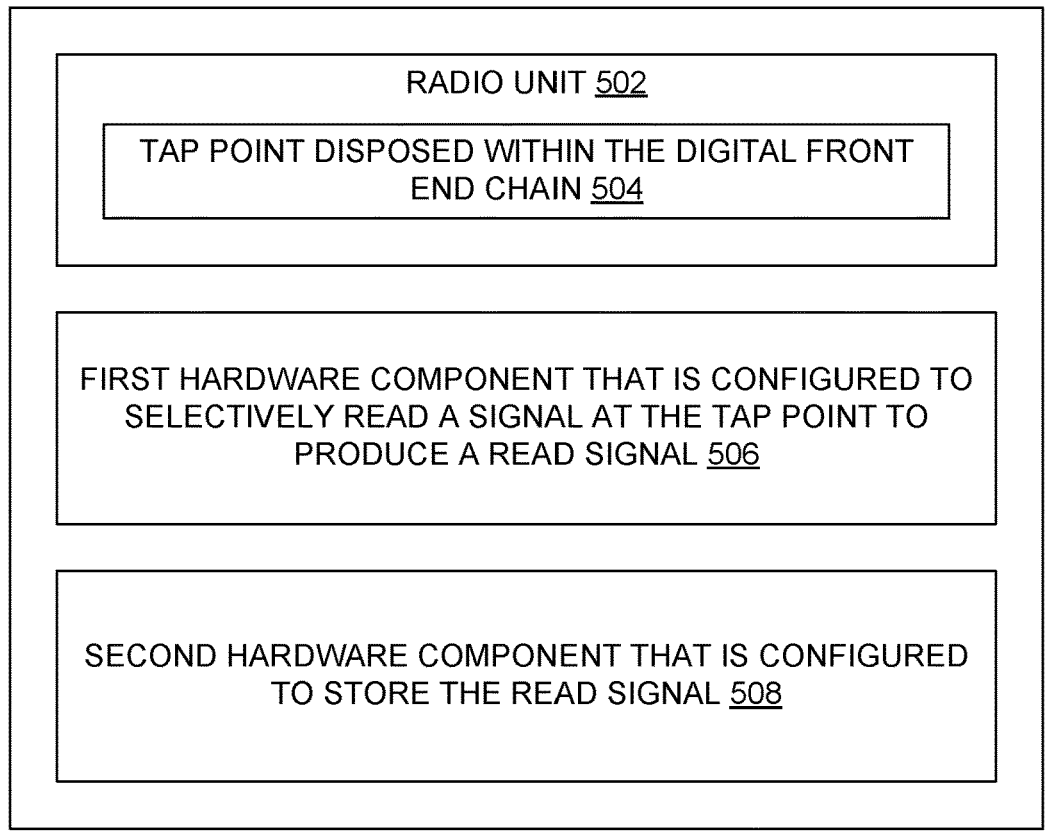
FIG. 5 illustrates an example system architecture that can facilitate capture and storage from signal tap points in a radio system, in accordance with an embodiment of this disclosure.

FIG. 5 illustrates an example system architecture 500 that can facilitate capture and storage from signal tap points in a radio system, in accordance with an embodiment of this disclosure. In some examples, part(s) of system architecture 500 can be used to implement part(s) of system architecture 100 of FIGS. 1A, 1B, and 1C, and/or system architecture 200.

System architecture 500 comprises radio unit 502 (which comprises a digital front end chain); tap point disposed within the digital front end chain 504; first hardware component that is configured to selectively read a signal at the tap point to produce a read signal 506; and second hardware component that is configured to store the read signal 508.

First hardware component 506 can selectively read a signal where first hardware component 506 reads the signal for a defined time period or a defined frequency or frequencies.

In some examples, radio unit can be similar to a combination of system architecture 100 of FIGS. 1A, 1B, and 1C (which generally depicts a down link chain of a radio system) and system architecture 200 (which generally depicts an up link (UL) chain of a radio system).

Tap point disposed within the digital front end chain 504 can be similar to tap point 148A or tap point 248A. In some examples, tap point disposed within the digital front end chain 504 can be configured to time align a signal at the tap point with a system time of the radio unit. This time alignment can be effectuated by a component similar to time alignment 116 or time alignment 204.

First hardware component that is configured to selectively read the signal at the tap point to produce a read signal 506 can be similar to capture 142 or capture 218. Second hardware component that is configured to store the read signal 508 can be similar to storage 170, or storage 228.

In some examples, the read signal is represented in a time domain of the radio unit. That is, the read signal can be captured at a tap point in a time domain (e.g., tap point 148A or tap point 248A). In such examples, the read signal can also be stored in a time domain representation. That is, the read signal can be stored without conversion to a frequency domain such as with a Fast Fourier Transform conversion.

Figure 6:
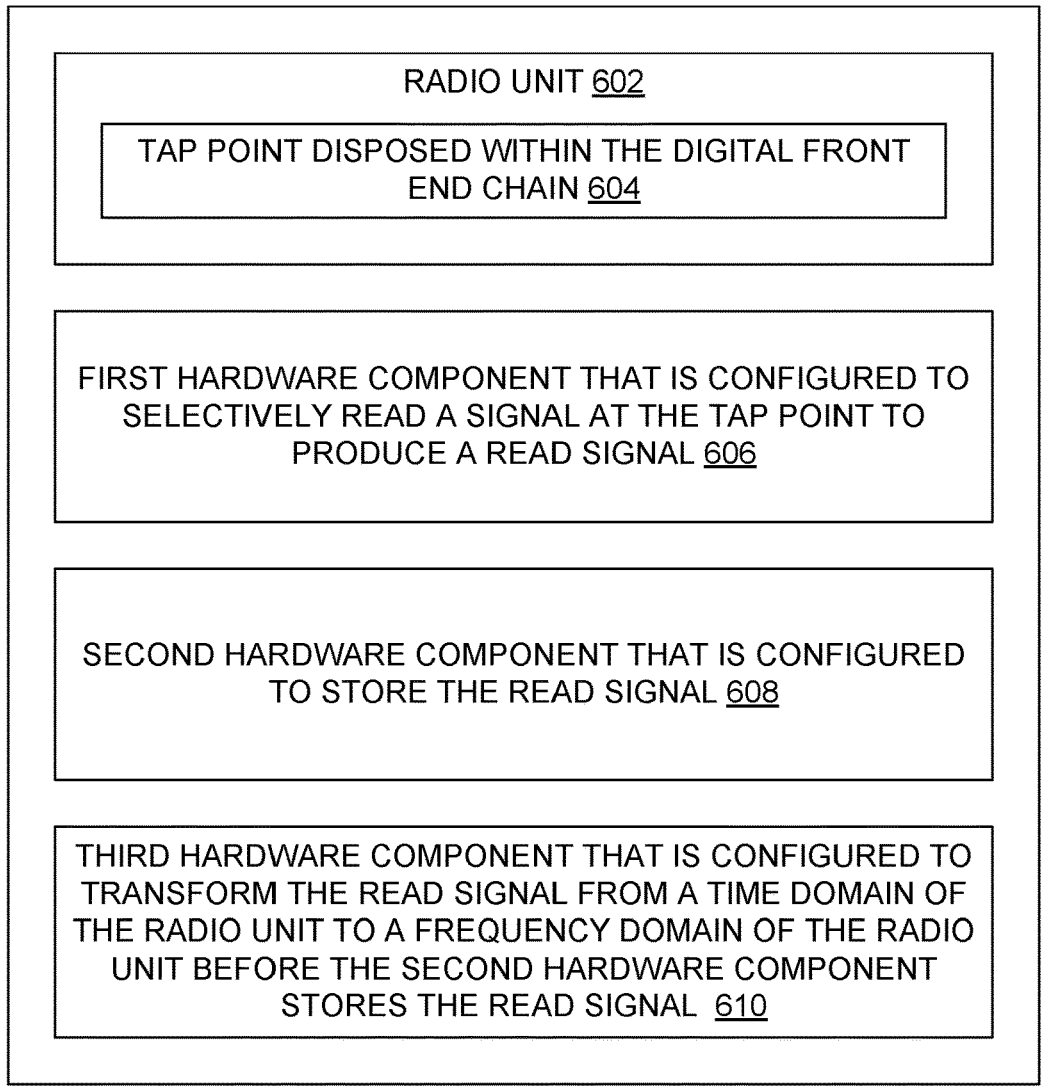
FIG. 6 illustrates another example system architecture that can facilitate capture and storage from signal tap points in a radio system, in accordance with an embodiment of this disclosure.

FIG. 6 illustrates another example system architecture 600 that can facilitate capture and storage from signal tap points in a radio system, in accordance with an embodiment of this disclosure. In some examples, part(s) of system architecture 600 can be used to implement part(s) of system architecture 100, and/or system architecture 200.

System architecture 600 comprises radio unit 602 (which can be similar to radio unit 502 of FIG. 5); tap point disposed within the digital front end chain 604 (which can be similar to tap point disposed within the digital front end chain 504); first hardware component that is configured to selectively read the signal at the tap point to produce a read signal 606 (which can be similar to first hardware component that is configured to selectively read the signal at the tap point to produce a read signal 506); second hardware component that is configured to store the read signal 608 (which can be similar to second hardware component that is configured to store the read signal 508); and third hardware component that is configured to transform the read signal from a time domain of the radio unit to a frequency domain of the radio unit before the second hardware component stores the read signal 610.

In some examples, third hardware component configured to transform the read signal from a time domain of the radio unit to a frequency domain of the radio unit before the second hardware component stores the read signal 610 can be similar to a functionality provided by optional FFT and CP removal 162 or optional FFT and CP removal.

In some examples, third hardware component 610 is further configured to selectively filter frequencies of the read signal in the frequency domain from the read signal before the second hardware component stores the read signal.

Figure 7:
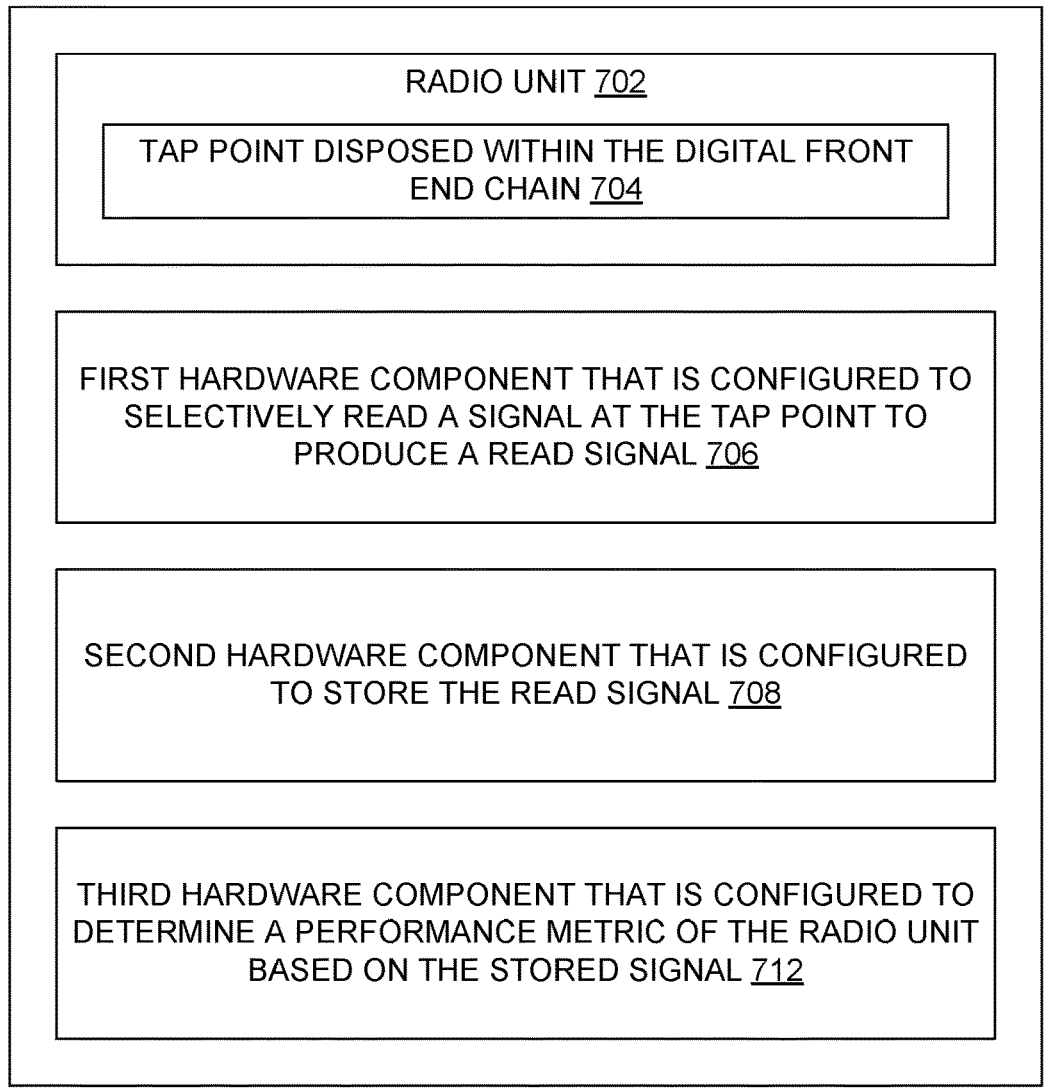
FIG. 7 illustrates another example system architecture that can facilitate capture and storage from signal tap points in a radio system, in accordance with an embodiment of this disclosure.

FIG. 7 illustrates another example system architecture 700 that can facilitate capture and storage from signal tap points in a radio system, in accordance with an embodiment of this disclosure. In some examples, part(s) of system architecture 700 can be used to implement part(s) of system architecture 100, and/or system architecture 200.

System architecture 700 comprises radio unit 702 (which can be similar to radio unit 502 of FIG. 5); tap point disposed within the digital front end chain 704 (which can be similar to tap point disposed within the digital front end chain 504); first hardware component that is configured to selectively read the signal at the tap point to produce a read signal 706 (which can be similar to first hardware component that is configured to selectively read the signal at the tap point to produce a read signal 506); second hardware component that is configured to store the read signal 708 (which can be similar to second hardware component that is configured to store the read signal 508); and third hardware component that is configured to determine a performance metric of the radio unit based on the stored signal 712.

In some examples, third hardware component that is configured to determine a performance metric of the radio unit based on the stored signal 712 can be similar to analysis and fault detection 164 or power detection, analysis, and fault detection 224.

In some examples, the performance metric comprises a health assessment metric, an early failure metric, a no fault found event capture, a black box flight recorder metric, a soft failure metric, or an aging metric.

Figure 8:
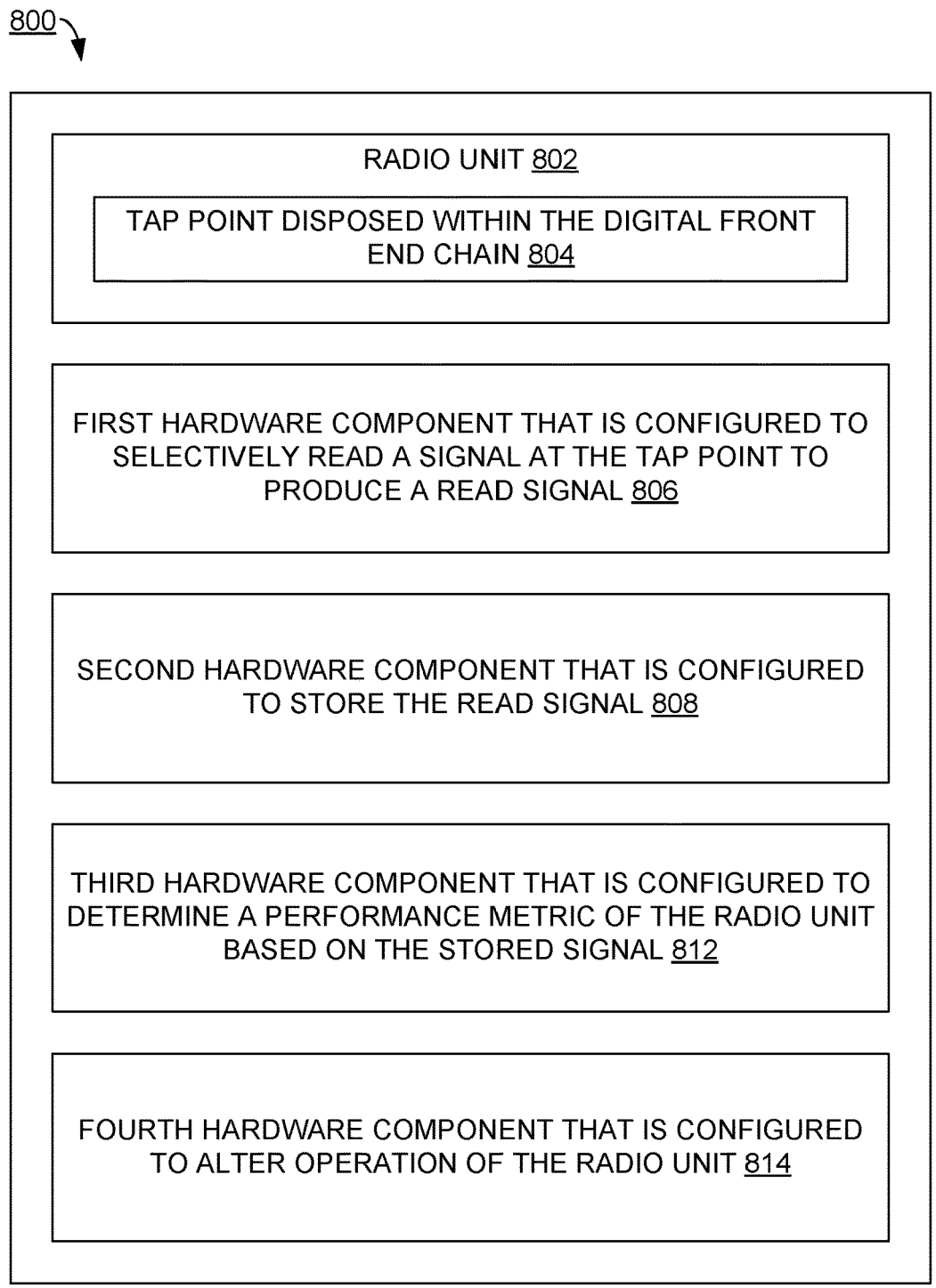
FIG. 8 illustrates another example system architecture that can facilitate capture and storage from signal tap points in a radio system, in accordance with an embodiment of this disclosure.

FIG. 8 illustrates another example system architecture that can facilitate capture and storage from signal tap points in a radio system, in accordance with an embodiment of this disclosure. In some examples, part(s) of system architecture 800 can be used to implement part(s) of system architecture 100, and/or system architecture 200.

System architecture 800 comprises radio unit 802 (which can be similar to radio unit 502 of FIG. 5); tap point disposed within the digital front end chain 804 (which can be similar to tap point disposed within the digital front end chain 504); first hardware component that is configured to selectively read the signal at the tap point to produce a read signal 806 (which can be similar to first hardware component that is configured to selectively read the signal at the tap point to produce a read signal 506); second hardware component that is configured to store the read signal 808 (which can be similar to second hardware component that is configured to store the read signal 508); third hardware component that is configured to determine a performance metric of the radio unit based on the stored signal 812 (which can be similar to third hardware component that is configured to determine a performance metric of the radio unit based on the stored signal 712 of FIG. 7); and fourth hardware component that is configured to alter operation of the radio unit 814.

In some examples, fourth hardware component that is configured to alter operation of the radio unit 814 can be configured to alter operation of the radio unit based on the performance metric.

In some examples, fourth hardware component that is configured to alter operation of the radio unit 814 can be configured to increase an efficiency of the radio unit based on using artificial intelligence to determine network efficiency management based on the performance metric In some examples, fourth hardware component that is configured to alter operation of the radio unit 814 can be similar to analysis and fault detection 164, or power detection, analysis, and fault detection 224.

FIG. 9 illustrates another example system architecture 900 that can facilitate capture and storage from signal tap points in a radio system, in accordance with an embodiment of this disclosure. In some examples, part(s) of system architecture 900 can be used to implement part(s) of system architecture 100, and/or system architecture 200.

System architecture 900 comprises first hardware component that is configured to selectively read a signal from a tap point that is disposed within a digital front end chain of a radio unit to produce a read signal 902; and second hardware component that is configured to store the read signal 904.

In some examples, first hardware component that is configured to selectively read a signal from a tap point that is disposed within a digital front end chain of a radio unit to produce a read signal 902 can be similar to capture 142. In some examples, second hardware component that is configured to store the read signal 904 can be similar to storage 170.

In some examples, the signal read by first hardware component 902 is time aligned at the tap point on a system time of the radio unit. This time alignment can be effectuated by a component similar to time alignment 116 or time alignment 204.

In some examples, second hardware component 904 is configured to remove a cyclic prefix from the read signal before storing the read signal. In some examples, second hardware component 904 is configured to store the read signal with a cyclic prefix preserved. That is, part(s) of second hardware component 904 can be similar to optional FFT and CP removal 162 or optional FFT and CP removal 220.

In some examples, the read signal spans one or more time boundaries of the radio unit. That is, data can be captured and stored to memory over a single time boundary or multiple time boundaries. In some examples, the read signal is aligned to a symbol or a system time boundary of the radio unit. That is, data can be aligned on a symbol or other system time boundaries.

Example Process Flows

Figure 10:
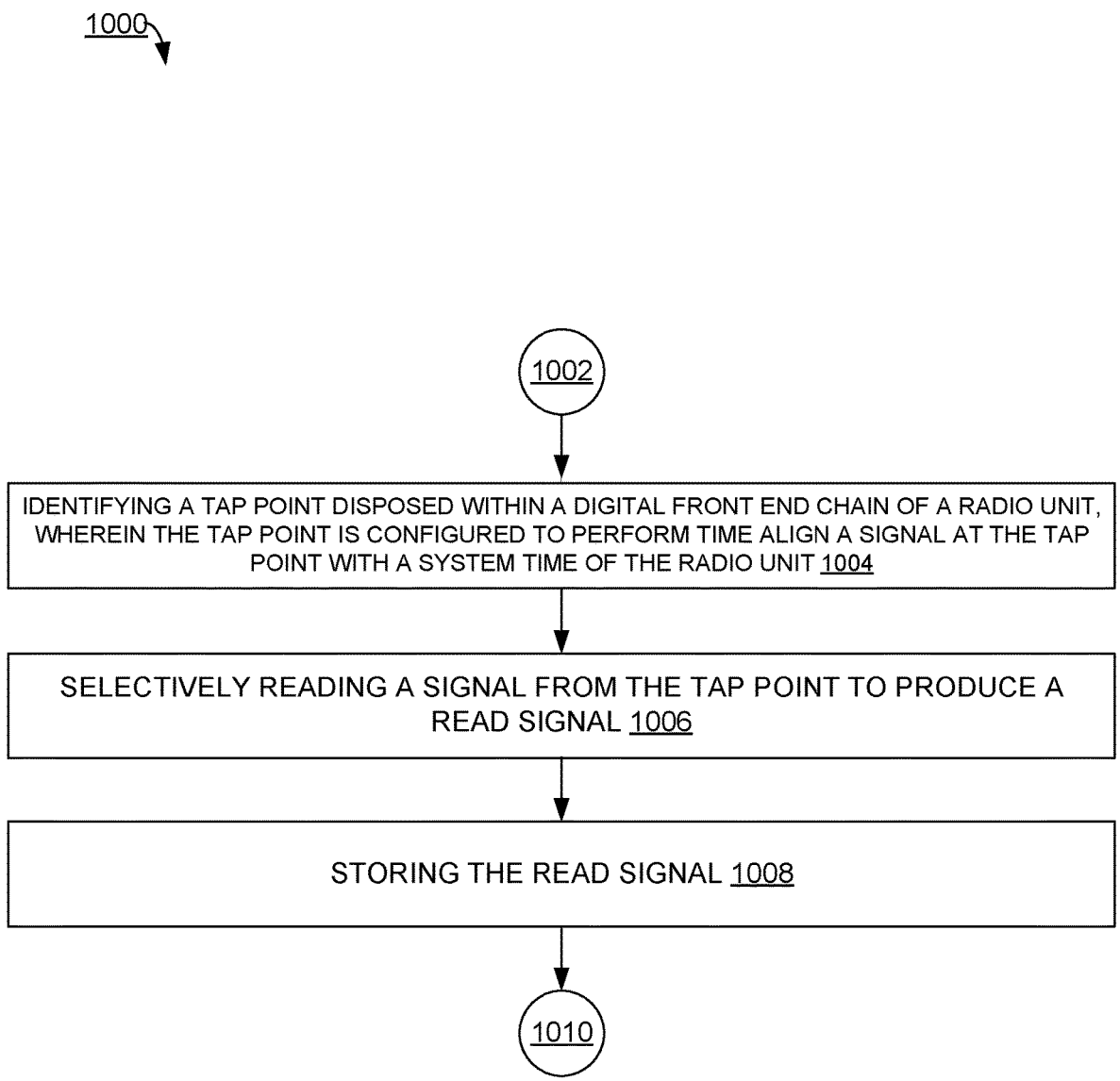
FIG. 10 illustrates an example process flow that can facilitate capture and storage from signal tap points in a radio system, in accordance with an embodiment of this disclosure.

FIG. 10 illustrates an example process flow 1000 that can facilitate capture and storage from signal tap points in a radio system, in accordance with an embodiment of this disclosure. In some examples, one or more embodiments of process flow 1000 can be implemented by system architecture 100 or system architecture 200.

It can be appreciated that the operating procedures of process flow 1000 are example operating procedures, and that there can be embodiments that implement more or fewer operating procedures than are depicted, or that implement the depicted operating procedures in a different order than as depicted. In some examples, process flow 1000 can be implemented in conjunction with one or more embodiments of process flow 1100 of FIG. 11.

Process flow 1000 begins with 1002, and moves to operation 1004.

Operation 1004 depicts identifying a tap point disposed within a digital front end chain of a radio unit, wherein the tap point is configured to perform time align a signal at the tap point with a system time of the radio unit. This can comprise identifying a tap point of system architecture 100 (e.g., tap point 148A) or a tap point of system architecture 200 (e.g., tap point 248A) to read a signal from.

In some examples, the tap point is disposed at an output of a crest factor reduction output signal block of the digital front end chain. That is, a tap point can be placed to read a CFR_OUT_Signal. This can be similar to tap point 148C.

In some examples, the tap point is disposed at an output of a digital pre-distortion output signal block of the digital front end chain. That is, tap point 148D can be placed to read a DPD_OUT_Signal.

In some examples, the tap point is disposed to capture an error signal transmitted through the digital front end chain. That is, a tap point can be placed to read an Error_Signal. This can be similar to tap point 148F.

In some examples, the tap point is disposed at an output of a feedback received signal analog-to-digital converter of the digital front end chain. That is, a tap point can be placed to read a FBRX_IN_Signal. This can be similar to tap point 148E.

After operation 1004, process flow 1000 moves to operation 1006.

Operation 1006 depicts selectively reading a signal from the tap point to produce a read signal. This can comprise capturing a signal that passes through a tap point, such as with capture 142 or capture 218.

After operation 1006, process flow 1000 moves to operation 1008.

Operation 1008 depicts storing the read signal. This can comprise storing the read signal at storage 170, or storage 228.

After operation 1008, process flow 1000 moves to 1010, where process flow 1000 ends.

FIG. 11 illustrates another example process flow 1100 that can facilitate capture and storage from signal tap points in a radio system, in accordance with an embodiment of this disclosure. In some examples, one or more embodiments of process flow 1100 can be implemented by system architecture 100 or system architecture 200.

It can be appreciated that the operating procedures of process flow 1100 are example operating procedures, and that there can be embodiments that implement more or fewer operating procedures than are depicted, or that implement the depicted operating procedures in a different order than as depicted. In some examples, process flow 1100 can be implemented in conjunction with one or more embodiments of process flow 1000 of FIG. 10.

Process flow 1100 begins with 1102, and moves to operation 1104.

Operation 1104 depicts reading a first signal from a first tap point that is disposed within a digital front end chain and that corresponds to a first antenna of a radio unit. In some examples, a radio system can comprise multiple antennas, each having a corresponding radio unit (which can comprise a combination of an instance of system architecture 100 and system architecture 200). In such examples, each signal chain for each antenna can have one or more tap points (e.g., similar to tap point 148A, or tap point 248A). In operation 1104 a digital front end chain of a first antenna can have a tap point from which a signal is read.

After operation 1104, process flow 1100 moves to operation 1106.

Operation 1106 depicts reading a second signal from a second tap point that is disposed within the digital front end chain and that corresponds to a second antenna of the radio unit. As described, a ratio system can comprise multiple antennas, such as a first antenna and a second antenna. With regard to the second antenna, in operation 1106 a digital front end chain of a first antenna can have a tap point from which a signal is read.

In some examples, operation 1106 comprises reading the first signal concurrently with reading the second signal. That is, multiple tap points in a radio system can be read at the same time, and this can include multiple tap points across multiple antennas.

After operation 1106, process flow 1100 moves to 1108, where process flow 1100 ends.

Example Architecture

Figure 12:
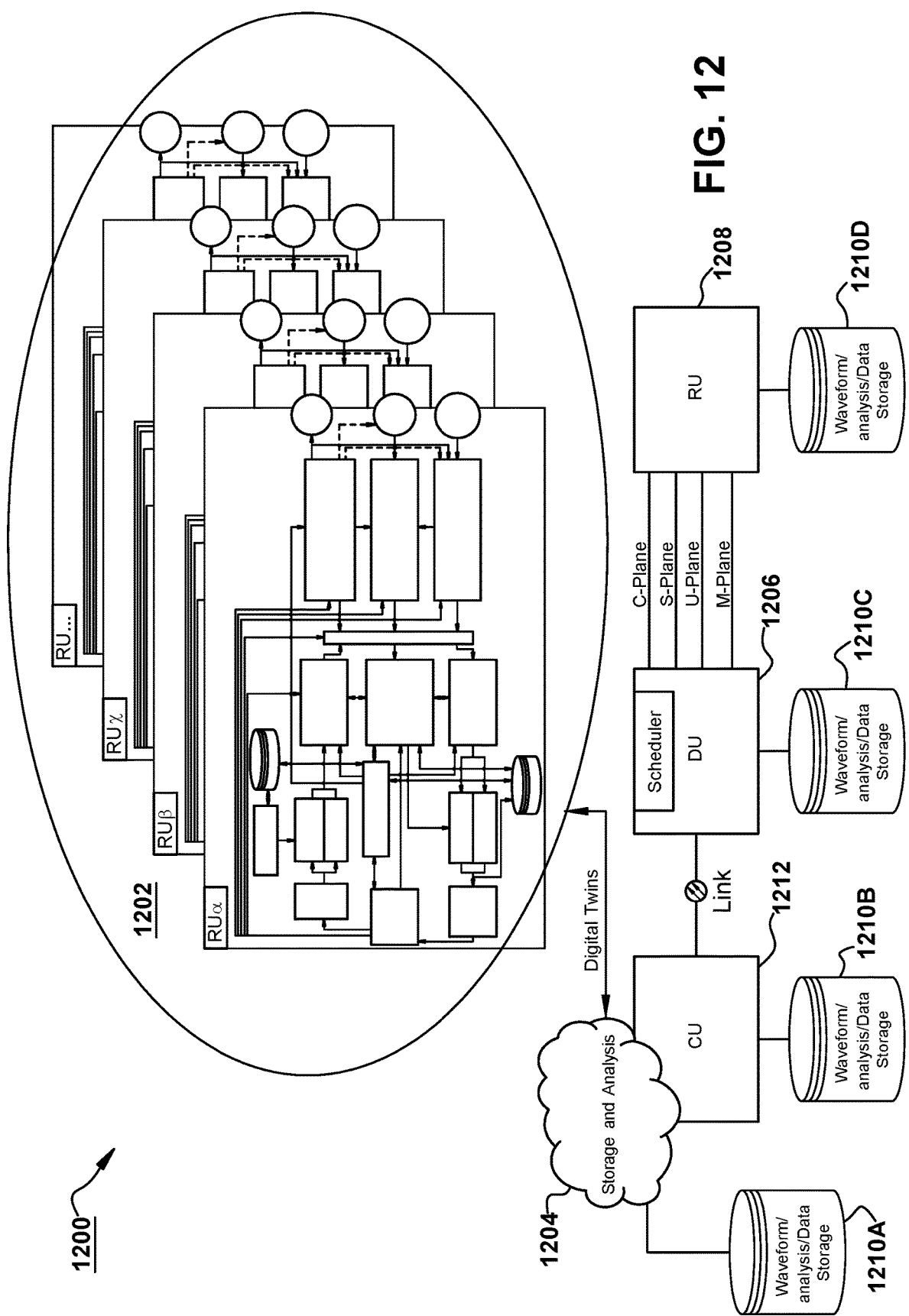
FIG. 12 illustrates an example system architecture for using capture and storage of a signal from tap points for a digital twin and/or predictive modeling, and that can facilitate capture and storage from signal tap points, in accordance with an embodiment of this disclosure.

FIG. 12 illustrates an example system architecture 1200 for using capture and storage of a signal from tap points for a digital twin and/or predictive modeling, and that can facilitate capture and storage from signal tap points, in accordance with an embodiment of this disclosure.

In some examples, system architecture 1200 can utilize signals captured in tap points in system architecture 100, and/or system architecture 200 to produce a digital twin of a corresponding radio system and/or perform predictive modeling of the radio system.

System architecture 1200 comprises models 1202, storage and analysis 1204, distributed unit 1206, radio unit 1208, waveform/analysis/data storage 1210A, waveform/analysis/data storage 1210B, waveform/analysis/data storage 1210C, waveform/analysis/data storage 1210D, and central unit (CU) 1212.

Tap points disposed in radio unit 1208 and/or distributed unit 1206 can be used to capture signals. This information can be transmitted to central unit 1210 for storage and analysis 1204. Storage and analysis 1204 can produce models 1202. Models 1202 can be digital twins of radio systems, including a radio system comprising distributed unit 1206 and radio unit 1208. Models 1202 can also be other forms of modeling of a radio system to be used in predictive modeling of how the radio system will behave in the future (e.g., how it will perform, or whether it will need repair).

A digital twin can generally comprise a computer model of a radio system (rather than an actual physical radio system), and can be used to estimate how the corresponding physical radio system will behave.

Captured signals can also be stored and/or analyzed in various locations at waveform/analysis/data storage 1210A, waveform/analysis/data storage 1210B, waveform/analysis/data storage 1210C, and/or waveform/analysis/data storage 1210D.

CONCLUSION

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. For instance, when a processor executes instructions to perform "operations", this could include the processor performing the operations directly and/or facilitating, directing, or cooperating with another device or component to perform the operations.

In the subject specification, terms such as "datastore," data storage," "database," "cache," and substantially any other information storage component relevant to operation and functionality of a component, refer to "memory components," or entities embodied in a "memory" or components comprising the memory. It will be appreciated that the memory components, or computer-readable storage media, described herein can be either volatile memory or nonvolatile storage, or can include both volatile and nonvolatile storage. By way of illustration, and not limitation, nonvolatile storage can include ROM, programmable ROM (PROM), EPROM, EEPROM, or flash memory. Volatile memory can include RAM, which acts as external cache memory. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated embodiments of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an ASIC, or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or application programming interface (API) components.

Further, the various embodiments can be implemented as a method, apparatus, or article of manufacture using standard programming and/or engineering techniques to produce software, firmware, hardware, or any combination thereof to control a computer to implement one or more embodiments of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical discs (e.g., CD, DVD . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any embodiment or design described herein as "exemplary" is not necessarily to be construed as preferred or advantageous over other embodiments or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a radio unit comprising a digital front end chain;
a tap point disposed within the digital front end chain, wherein the tap point is configured to time align a signal at the tap point with a system time of the radio unit;
a first hardware component that is configured to selectively read the signal at the tap point to produce a read signal;
a second hardware component that is configured to store the read signal; and
a third hardware component configured to transform the read signal from a time domain of the radio unit to a frequency domain of the radio unit before the second hardware component stores the read signal.

2. The system of claim 1, wherein the read signal is represented in a time domain of the radio unit.

3. The system of claim 1, wherein the third hardware component is configured to selectively filter frequencies of the read signal in the frequency domain from the read signal before the second hardware component stores the read signal.

4. The system of claim 1, wherein the second hardware component is configured to store the read signal as a stored signal, and further comprising:
a fourth hardware component that is configured to determine a performance metric of the radio unit based on the stored signal.

5. The system of claim 4, wherein the performance metric comprises a health assessment metric, an early failure metric, a no fault found event capture, a black box flight recorder metric, a soft failure metric, or an aging metric.

6. The system of claim 4, further comprising:
a fifth hardware component that is configured to alter operation of the radio unit based on the performance metric.

7. The system of claim 6, wherein the fifth hardware component is configured to use artificial intelligence to determine network efficiency management, and wherein altering the operation of the radio unit comprises increasing an efficiency of the radio unit.

8. The system of claim 1, wherein the read signal spans one or more time boundaries of the radio unit.

9. A method, comprising:
identifying, by a system comprising at least one processor, a tap point disposed within a digital front end chain of a radio unit, wherein the tap point is configured to time align a signal at the tap point with a system time of the radio unit;
selectively reading, by the system, a signal from the tap point to produce a read signal;
transforming the read signal from a time domain of the radio unit to a frequency domain of the radio unit, to produce a transformed read signal; and
storing, by the system, the transformed read signal.

10. The method of claim 9, wherein the tap point is disposed at an output of a crest factor reduction output signal block of the digital front end chain.

11. The method of claim 9, wherein the tap point is disposed at an output of a digital pre-distortion output signal block of the digital front end chain.

12. The method of claim 9, wherein the tap point is disposed to capture an error signal transmitted through the digital front end chain.

13. The method of claim 9, wherein the tap point is disposed at an output of a feedback received signal analog-to-digital converter of the digital front end chain.

14. The method of claim 9, wherein the signal is a first signal, wherein the tap point is a first tap point that corresponds to a first antenna of the radio unit, and further comprising:
reading, by the system, a second signal from a second tap point that is disposed within the digital front end chain and that corresponds to a second antenna of the radio unit.

15. The method of claim 14, further comprising:
reading, by the system, the first signal concurrently with reading the second signal.

16. An apparatus, comprising:
a first hardware component that is configured to selectively read a signal from a tap point that is disposed within a digital front end chain of a radio unit to produce a read signal, wherein the signal is time aligned at the tap point on a system time of the radio unit;
a second hardware component that is configured to store the read signal; and
a third hardware component configured to transform the read signal from a time domain of the radio unit to a frequency domain of the radio unit before the second hardware component stores the read signal.

17. The apparatus of claim 16, wherein the second hardware component is configured to remove a cyclic prefix from the read signal before storing the read signal.

18. The apparatus of claim 16, wherein the second hardware component is configured to store the read signal with a cyclic prefix preserved.

19. The apparatus of claim 16, wherein the read signal spans one or more time boundaries of the radio unit.

20. The apparatus of claim 16, wherein the read signal is aligned to a symbol or a system time boundary of the radio unit.

\* \* \* \* \*